(12) United States Patent
Zhao et al.

(10) Patent No.: US 12,343,711 B2
(45) Date of Patent: Jul. 1, 2025

(54) SEMICONDUCTOR MATERIAL BASED ON METAL NANOWIRES AND POROUS NITRIDE AND PREPARATION METHOD THEREOF

(71) Applicant: INSTITUTE OF SEMICONDUCTORS, CHINESE ACADEMY OF SCIENCES, Beijing (CN)

(72) Inventors: Lixia Zhao, Beijing (CN); Jing Li, Beijing (CN); Chao Yang, Beijing (CN); Zhiguo Yu, Beijing (CN); Xin Xi, Beijing (CN); Kaiyou Wang, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 982 days.

(21) Appl. No.: 17/256,762

(22) PCT Filed: Oct. 18, 2018

(86) PCT No.: PCT/CN2018/110866
§ 371 (c)(1),
(2) Date: May 5, 2021

(87) PCT Pub. No.: WO2020/006928
PCT Pub. Date: Jan. 9, 2020

(65) Prior Publication Data
US 2022/0088579 A1    Mar. 24, 2022

(30) Foreign Application Priority Data

Jul. 4, 2018    (CN) .......................... 201810722928.9

(51) Int. Cl.
*B82Y 30/00*    (2011.01)
*B01J 21/02*    (2006.01)
(Continued)

(52) U.S. Cl.
CPC ............... *B01J 27/24* (2013.01); *B01J 21/02* (2013.01); *B01J 23/50* (2013.01); *B01J 23/52* (2013.01);
(Continued)

(58) Field of Classification Search
None
See application file for complete search history.

(56) References Cited

U.S. PATENT DOCUMENTS

2010/0276664 A1    11/2010    Hersee

FOREIGN PATENT DOCUMENTS

| | | |
|---|---|---|
| CN | 101220466 A | 7/2008 |
| CN | 101689567 A | 3/2010 |
| CN | 103247709 A | 8/2013 |

OTHER PUBLICATIONS

Martin, "Nanomaterials: A Membrane-Based Synthetic Approach", 1994, Science, vol. 266 (5193), p. 1961-1966. (Year: 1994).*
(Continued)

*Primary Examiner* — Kim S. Horger
(74) *Attorney, Agent, or Firm* — Christopher R. Christenson; Kelly, Holt & Christenson, P.L.L.C.

(57) ABSTRACT

Provided are a semiconductor material based on metal nanowires and a porous nitride, and a preparation method thereof. The semiconductor material includes: a substrate; a buffer layer formed on the substrate; and a composite material layer formed on the buffer layer the composite material layer includes: a transverse porous nitride template layer; and a plurality of metal nanowires filled in pores of the transverse porous nitride template layer.

14 Claims, 4 Drawing Sheets

(51) Int. Cl.
| | |
|---|---|
| B01J 23/50 | (2006.01) |
| B01J 23/52 | (2006.01) |
| B01J 27/24 | (2006.01) |
| B01J 35/23 | (2024.01) |
| B01J 35/33 | (2024.01) |
| B01J 35/39 | (2024.01) |
| B01J 37/02 | (2006.01) |
| B01J 37/34 | (2006.01) |
| C01B 3/04 | (2006.01) |
| C23C 16/30 | (2006.01) |
| C23C 28/00 | (2006.01) |
| C25D 7/12 | (2006.01) |
| C30B 25/18 | (2006.01) |
| C30B 29/40 | (2006.01) |
| H10F 71/00 | (2025.01) |
| H10F 77/124 | (2025.01) |
| H10F 77/40 | (2025.01) |
| H10H 20/01 | (2025.01) |
| H10H 20/825 | (2025.01) |
| H10H 20/855 | (2025.01) |
| B82Y 15/00 | (2011.01) |
| B82Y 20/00 | (2011.01) |
| B82Y 40/00 | (2011.01) |
| C25D 3/44 | (2006.01) |
| C25D 3/46 | (2006.01) |
| C25D 3/48 | (2006.01) |

(52) U.S. Cl.
CPC ............... *B01J 35/23* (2024.01); *B01J 35/33* (2024.01); *B01J 35/39* (2024.01); *B01J 37/0207* (2013.01); *B01J 37/0215* (2013.01); *B01J 37/0242* (2013.01); *B01J 37/348* (2013.01); *C01B 3/042* (2013.01); *C23C 16/303* (2013.01); *C23C 28/32* (2013.01); *C23C 28/34* (2013.01); *C25D 7/12* (2013.01); *C30B 25/183* (2013.01); *C30B 29/403* (2013.01); *H10F 71/1274* (2025.01); *H10F 77/12485* (2025.01); *H10F 77/413* (2025.01); *H10H 20/0137* (2025.01); *H10H 20/825* (2025.01); *H10H 20/855* (2025.01); *B82Y 15/00* (2013.01); *B82Y 20/00* (2013.01); *B82Y 30/00* (2013.01); *B82Y 40/00* (2013.01); *C25D 3/44* (2013.01); *C25D 3/46* (2013.01); *C25D 3/48* (2013.01)

(56) References Cited

OTHER PUBLICATIONS

Yang, et al., "GaN with Laterally Aligned Nanopores to Enhance the Water Splitting", 2017, Journal of Physical Chemistry C, vol. 121, p. 7331-7336. (Year: 2017).*

Tan et al., "Growth Mechanism of Single Crystal Nanowires of fcc Metals (Ag, Cu, Ni) and hcp Metal (Co) Electrodeposited", 2012 (first published Dec. 8, 2011), J. Electrochem. Soc., vol. 159, p. K15-K20. (Year: 2012).*

International Search Report dated Dec. 17, 2018, for International Patent Application No. PCT/CN2018/110866. 2 pages.

* cited by examiner

SEMICONDUCTOR MATERIAL BASED ON METAL NANOWIRES AND POROUS NITRIDE AND PREPARATION METHOD THEREOF

CROSS-REFERENCE TO RELATED APPLICATION

This application is a Section 371 National Stage Application of International Application No. PCT/CN2018/110866, filed on Oct. 18, 2018, which claims priority to Chinese Application No. 201810722928.9, filed on Jul. 4, 2018, incorporated herein by reference in their entirety.

TECHNICAL FIELD

The present disclosure relates to the field of new materials and material preparation, in particular to a semiconductor material based on metal nanowires and porous nitride and a preparation method thereof.

BACKGROUND

Group III nitrides represented by GaN are a direct bandgap semiconductor material. The bandgap thereof can cover the entire solar spectrum by adjusting the proportion of Al or In incorporated, at the same time, it has many advantages such as high breakdown voltage, strong radiation resistance, and high electron mobility, good thermal and chemical stability, etc. Compared with traditional bulk materials, the transverse porous nitride also has characteristics of a large specific surface area, nano-scale effects and interface effects on transverse porous channels and pore walls, which may effectively enhance its properties such as photoelectric response characteristics, nonlinear optical characteristics and photocatalytic characteristics or the like, and it has huge application potential in the fields of luminescence, detection, catalysis and nano-optoelectronics or the like.

The plasma energy of precious metals such as Au, Ag, Al and their alloys is close to the bandwidth of nitride. They are the first choice for exciting surface plasmons in the ultraviolet, visible and near-infrared bands, and are widely used in surface plasmon-enhanced nitride in the luminescence and detection devices. At the same time, Au and Ag have stable chemical properties and are not easily corroded during the photo-electrochemical reaction. They can be used as the active point of the reduction reaction to effectively capture the photo-generated electrons on the semiconductor surface and greatly improve the photocatalytic efficiency of nitride. However, in these applications, on one aspect, precious metals are only introduced on the surface of the semiconductor, and the local surface plasmon enhancement effect is generated at the interface of the metal and the semiconductor under light irradiation, which is not conducive to improving the photoelectric characteristics within the semiconductor material; on another aspect, precious metals are introduced into the semiconductor during material growth or by manners such as dry etching in the subsequent tape-out process, it is necessary to consider the complex factors of material growth, and there will be problems such as leakage caused by dry etching damage.

SUMMARY

The present disclosure provides a semiconductor material based on metal nanowires and a porous nitride, and a preparation method thereof. The semiconductor material comprises: a substrate; a buffer layer formed on the substrate; a composite material layer formed on the buffer layer, the composite material layer comprises: a transverse porous nitride template layer; and a plurality of metal nanowires filled in pores of the transverse porous nitride template layer.

It can be seen from the above technical solution that the embodiments of the present disclosure have at least the following benefits:

The local electric field enhancement caused by the surface plasmon resonance of the metal nanowires improves its response ability to light from visible light to ultraviolet wavelengths, the semiconductor material has strong light absorption and response capability in the range from ultraviolet to visible light, and can be widely used in photolysis of water for hydrogen preparation and fields of plasmon-enhanced semiconductor detection and luminescence. The preparation of the semiconductor material is environmentally friendly and economical.

BRIEF DESCRIPTION OF THE DRAWINGS

The accompanying drawings are provided for further understanding of the present disclosure, the drawings constitute a part of the specification, and are used to explain the present disclosure together with the specific embodiments below, and do not limit the present disclosure. In the drawings.

Figure 1:
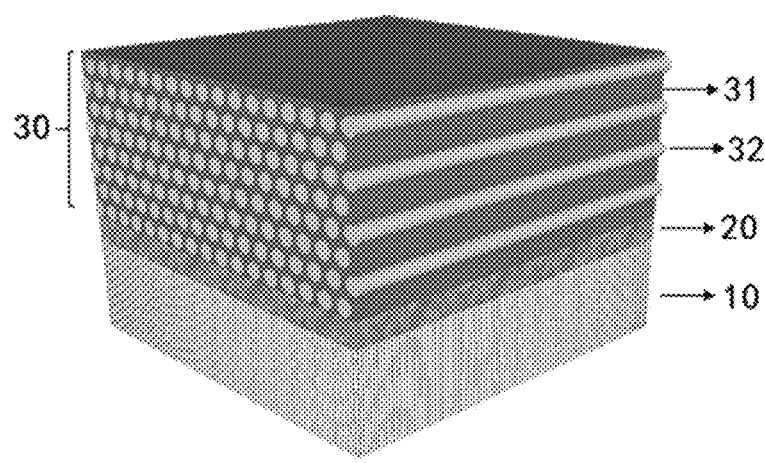
FIG. 1 is a schematic three-dimensional structural diagram of the semiconductor material based on metal nanowires and porous nitride according to the embodiments of the present disclosure.

REFERENCE NUMERALS 10 substrate
20 buffer layer
30 composite material layer
31 transverse porous nitride template layer
32 metal nanowire

DETAILED DESCRIPTION OF EMBODIMENTS

In order to make the objectives, technical solutions, and advantages of the present disclosure clearer, the present disclosure will be described further in detail below with reference to specific embodiments and drawings.

The present disclosure provides a semiconductor material base on metal nanowires and porous nitride and a preparation method thereof. The local electric field enhancement caused by the surface plasmon resonance of the metal nanowires improves light absorption and response ability of the composite material composed of metal nanowires and the porous nitride to light from visible light to ultraviolet wavelengths, and the preparation process is simple, environmentally friendly, and economical to alleviate technical problems in the prior art, for example, semiconductor materials are easily corroded during the photo-electrochemical reaction, the preparation process is complicated and the bulk materials are easily damaged when the local surface plasmon enhancement effect is used to improve the photoelectric characteristics of the semiconductor internal material.

In order to make the objectives, technical solutions, and advantages of the present disclosure clearer, the present disclosure will be described further in detail with reference to specific embodiments and drawings.

An embodiment of the present disclosure provides a semiconductor material based on metal nanowires and porous nitride, FIG. 1 is a schematic three-dimensional structural diagram of the semiconductor material based on the metal nanowires and the porous nitride, as shown in FIG. 1, the semiconductor material includes:
a substrate 10;
a buffer layer 20 formed on the substrate 10;
a composite material layer 30 formed on the buffer layer 20.

The composite material layer 30 includes:
a transverse porous nitride template layer 31, used to provide an electrochemical path for the synthesis of metal nanowires; and
a plurality of metal nanowires 32, filled in pores of the transverse porous nitride template layer 31.

In this embodiment, the preparation material of the substrate 10 may be sapphire, silicon or silicon carbide. The substrate may be a planar structure or a patterned structure.

The buffer layer 20 can be selected from materials such as GaN, AN, ZnO or graphene, etc. grown at a low temperature.

The transverse porous nitride template layer 31 can be selected from materials such as GaN, InGaN, AlGaN or AlInGaN, etc., and the transverse porous nitride template layer 31 is heavily n-type doped. The transverse porous nitride template layer 31 is formed with a plurality of layers of pores, the diameter of each pore is 5~100 nm, and the length of each pore is 1~300 μm.

The morphology of the pores can be cylindrical, triangular prismatic, or a mixed shape of the two alternately. For example, for each layer, the pores in the layer are in the form of alternating cylindrical pores and triangular prismatic pores, or the pores in even-numbered layers are all cylindrical pores, the pores in odd-numbered layers are all triangular prismatic pores, or the pores in the even-numbered layers are all triangular prismatic pores, and the pores in the odd-numbered layers are all cylindrical pores.

The metal nanowire 32 can be made of Au, Ag or Al, etc. The metal nanowire 32 is a monocrystal with a diameter of 5 to 100 nm and a length of 5 nm to 300 μm. Corresponding to the morphology of the pores of the transverse porous nitride template layer 31, the morphology of the metal nanowire includes: a cylindrical shape, a triangular prismatic shape, or a mixed shape of the two alternately.

It can be seen that the semiconductor material based on metal nanowires and porous nitride according to the present embodiments has strong light absorption and response capability in the range from ultraviolet to visible light, and can be widely used in photolysis of water for hydrogen preparation and fields of plasmon-enhanced semiconductor detection and luminescence.

Figure 2:
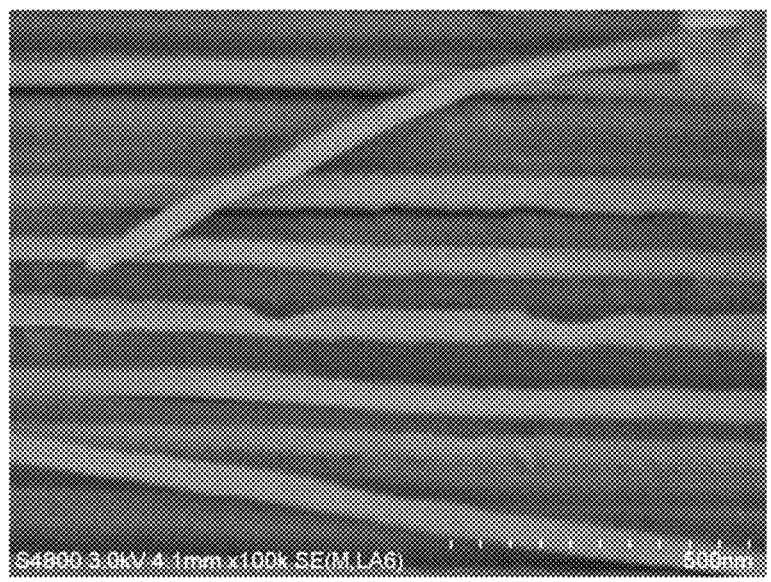
FIG. 2 is a schematic diagram of scanning electron microscope results of a cross-section of the semiconductor material based on Ag nanowires and transverse porous GaN according to the embodiments of the present disclosure.

In the following, the performance of the semiconductor material of this embodiment is described by taking the metal nanowires 32 using Ag and the transverse porous nitride template layer 31 using GaN as an example. FIG. 2 is a schematic diagram of scanning electron microscope results of a cross-section of the semiconductor material based on Ag nanowires and transverse porous GaN. The type of the scanning electron microscope model is S-4800, the accelerating voltage is 3KV, the working distance is 4.1 mm, the magnification is 100K, SE means a secondary electron, M means a hybrid probe, LA means a backscatter mode, 6 means a backscattered electron energy. As shown in FIG. 2, 500 nm is used as a reference ratio in FIG. 2. A pore size of the transverse porous GaN layer in this embodiment is preferably 40 nm, the channel length thereof is 150 μm, a diameter of Ag nanowires is preferably 40 nm, and the transverse porous GaN layer and the Ag nanowires are tightly combined to form a composite material layer of Ag nanowires and transverse porous GaN.

Figure 3:
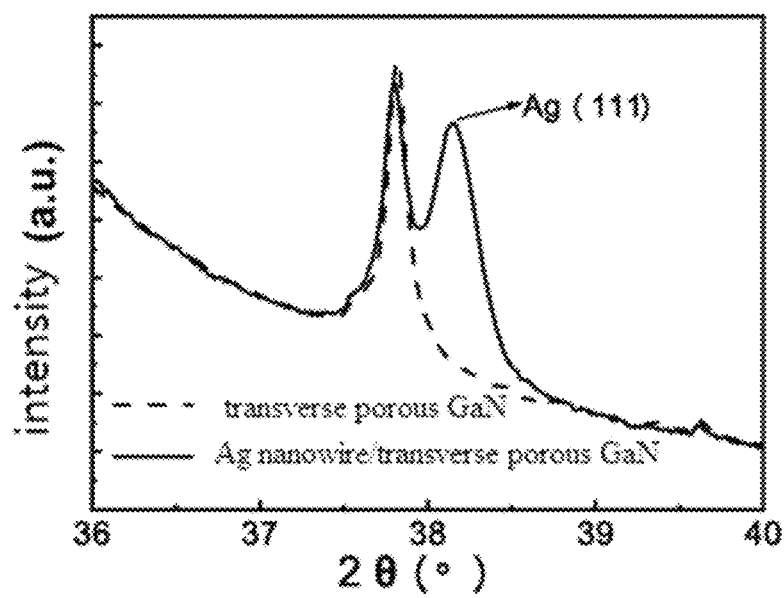
FIG. 3 is a schematic partially enlarged XRD diagram of the semiconductor based on Ag nanowires and transverse porous GaN according to the embodiments of the present disclosure.

FIG. 3 is a schematic partial enlarged XRD (X-ray diffraction) diagram of the semiconductor material based on Ag nanowires and transverse porous GaN. a.u. means that the ordinate is a relative coordinate, θ is an angle between the incident X-ray and the corresponding crystal plane during the XRD test. As shown in FIG. 3, the crystal phase of Ag nanowires in this embodiment is a cubic phase, and the crystal phase of the crystal is a curve 111.

Figure 4:
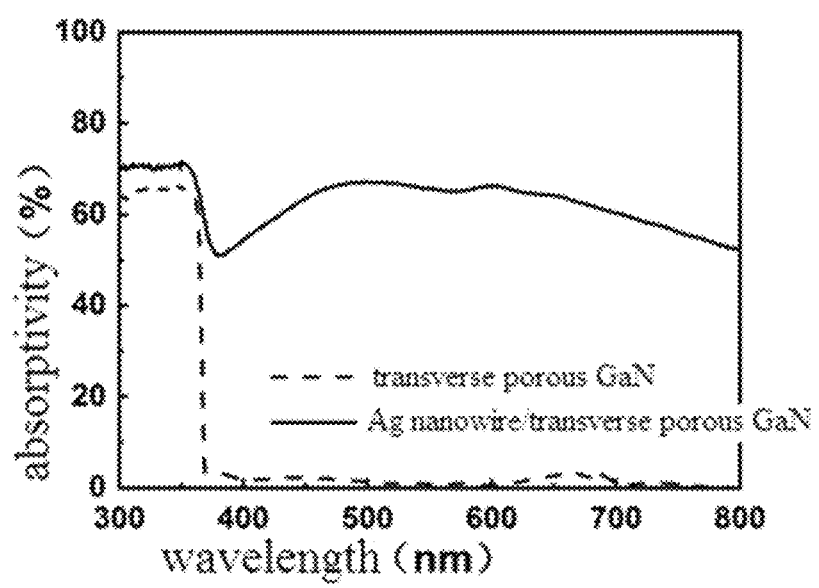
FIG. 4 is a schematic diagram of an absorption spectrum of the semiconductor material based on Ag nanowires and transverse porous GaN under light radiation of 300 nm-800 nm according to the embodiments of the present disclosure.

FIG. 4 is a schematic diagram of the absorption spectrum of the semiconductor material based on Ag nanowires and transverse porous GaN under light irradiation of 300 nm-800 nm. As shown in FIG. 4, the semiconductor material based on Ag nanowires and transverse porous GaN in this embodiment has strong absorption in the range of 300 nm~800 nm from ultraviolet to visible light, which breaks through the technical bottleneck of the photocatalytic effect of existing GaN only achieved under ultraviolet light, and has broad application prospects in the field of photocatalysis.

Figure 5:
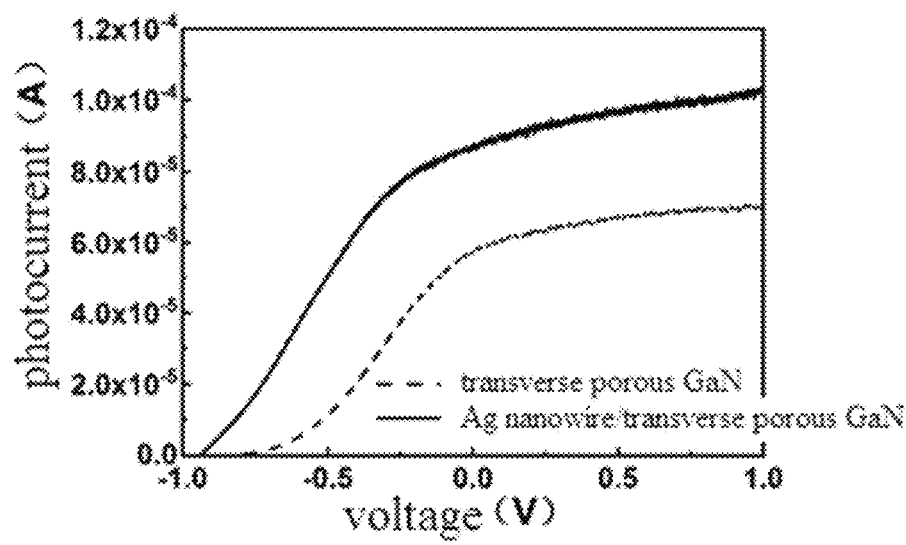
FIG. 5 is a schematic photocurrent-voltage diagram of a photo-hydrolysis experiment of the semiconductor based on Ag nanowires and transverse porous GaN according to the embodiments of the present disclosure.

FIG. 5 is a schematic photocurrent-voltage diagram of a photo-hydrolysis experiment of the semiconductor based on Ag nanowires and transverse porous GaN. As shown in FIG. 5, compared with pure transverse porous GaN, the photocurrent thereof is increased by more than 1.4 times.

Figure 6:
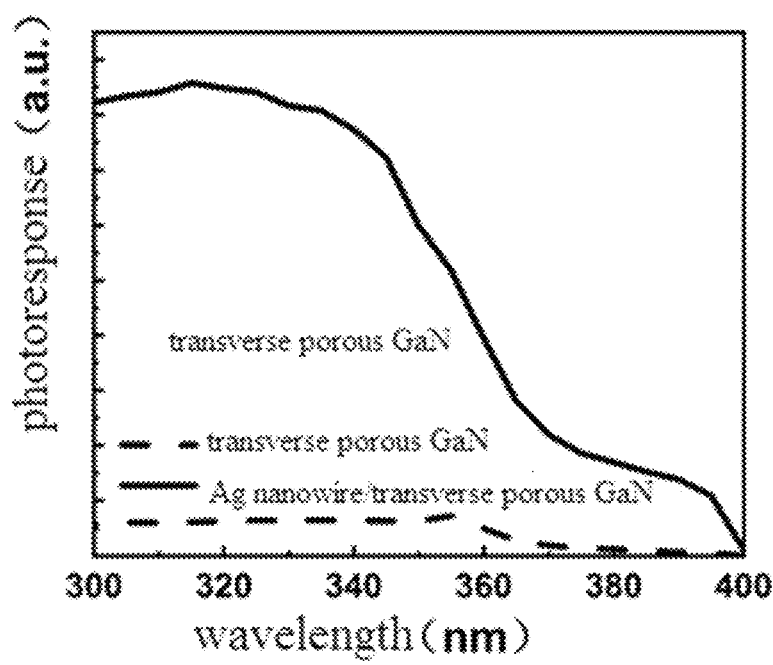
FIG. 6 is a schematic diagram of the spectral response of an ultraviolet photodetector experiment of the semiconductor material based on Ag nanowires and transverse porous GaN according to the embodiments of the present disclosure.

FIG. 6 is a schematic diagram of the spectral response of an ultraviolet photodetector experiment of the semiconductor material based on Ag nanowires and transverse porous GaN. a.u. means that the ordinate is a relative coordinate. As shown in FIG. 6, compared with pure transverse porous GaN, under a reverse bias of 2V, the photo response thereof is increased by more than 14 times, which improves the photoelectric conversion efficiency of GaN bulk materials, and has practical application prospects in the field of surface plasmon-enhanced semiconductor detectors.

Figure 7:
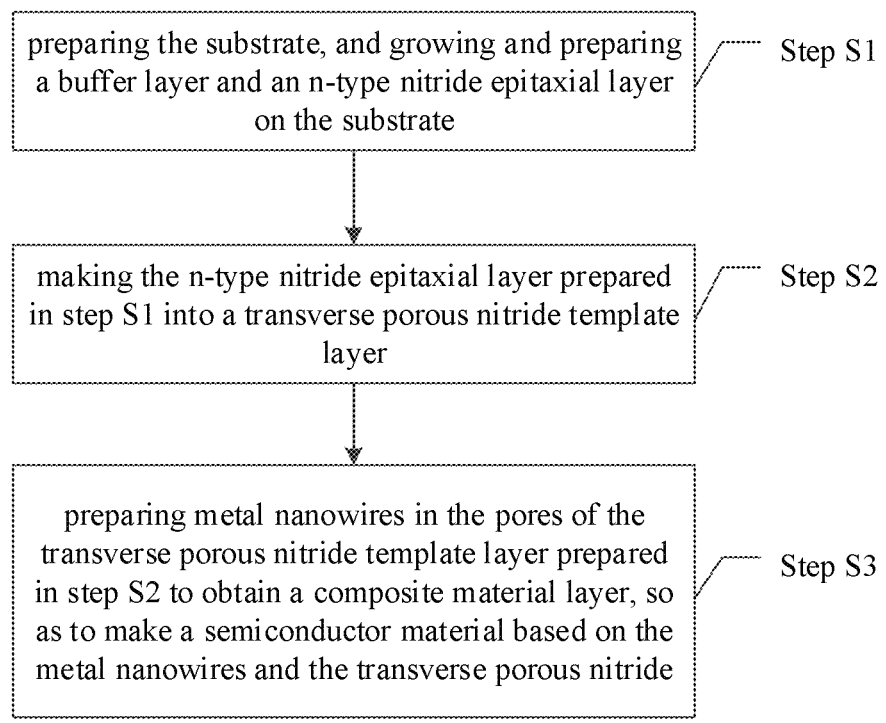
FIG. 7 is a flow chart of a preparation method of the semiconductor based on metal nanowires and transverse porous nitride according to the embodiments of the present disclosure.

Another embodiment of the present disclosure provides a method for preparing the semiconductor material based on metal nanowires and porous nitride. FIG. 7 is a flow chart of the preparation method. As shown in FIG. 7, the preparation method includes:
step S1: preparing a substrate 10, and growing and preparing a buffer layer 20 and an n-type nitride epitaxial layer on the substrate 10.

A metal-organic chemical vapor deposition method can be used to sequentially grow a low-temperature buffer layer 20 and an n-type nitride epitaxial layer on the substrate 10, and a doping concentration of the nitride epitaxial layer is $10^{18}$ $cm^{-3}$~$10^{19}$ $cm^{-3}$.

step S2: making the n-type nitride epitaxial layer prepared in step S1 into a transverse porous nitride template layer 31.

The transverse porous nitride template layer 31 is prepared on the n-type nitride epitaxial layer by an electrochemical corrosion method, and the residual electrochemical corrosive electrolyte is removed by ultrasonic cleaning with deionized water.

In the electrochemical corrosion method, the electrolyte is 70 wt % concentrated nitric acid or 1 mol/L NaOH, and the voltage of the electrochemical corrosion is 5~60V.

The time for ultrasonic cleaning with deionized water to remove residual electrochemical corrosive electrolyte is 10~30 min, and the ultrasonic frequency can be 100 Hz.

step S3: preparing metal nanowires 32 in the pores of the transverse porous nitride template layer 31 prepared in step S2 to obtain a composite material layer 30, so as to make a semiconductor material based on the metal nanowires and the transverse porous nitride.

In step S3, the transverse porous nitride template layer 31 is used as a carrier, and composite material layer 30 based on the metal nanowires and porous nitride are prepared by an electrochemical deposition method, the specific steps include:

An electroplating solution is prepared, and the electroplating solution can be any one of mixed solutions of $AgNO_3/H_3BO_3$, $HAuCl_4/Na_2SO_3/Na_2S_2O_3$ or $AlCl_3/NaCl/KCl$.

The transverse porous nitride template layer 31 is immersed in the electroplating solution, the immersed transverse porous nitride template layer 31 is used as a working electrode, the Pt sheet is used as a counter electrode, and the Ag/AgCl electrode is used as a reference electrode. The metal nanowires are electroplated and deposited at a certain process temperature to obtain the composite material layer 30, and then the semiconductor material based on the metal nanowires and the transverse porous nitride is prepared.

In this embodiment, a concentration of $AgNO_3$ in the electroplating solution is 0.01~0.05 mol/L, a concentration of $H_3BO_3$ is 0.01~0.05 mol/L, a concentration of $HAuCl_4$ is 0.005~0.05 mol/L, and a concentration of $Na_2SO_3$ is 0.04~0.5 mol/L, a concentration of $Na_2S_2O_3$ is 0.04~0.5 mol/L, a concentration of $AlCl_3$ solution is 0.01~0.05 mol/L, a concentration of NaCl solution is 0.005~0.01 mol/L, and a concentration of KCl solution is 0.005~0.01 mol/L.

The process temperature is 25~150° C. During the preparation of the electroplating solution in step S3, the electrolyte needs to be stirred and dissolved for 30~120 min. The immersion time of the transverse porous nitride template layer 31 is 30~120 min.

The electrochemical deposition method can be a constant voltage method, a constant current method, a pulse voltage method, etc. The deposition voltage is 0.9~6V, the deposition current is 0.1~3 mA, the pulse period is 10~100, and the duty ratio is 3:1, the deposition time is 30~120 min.

Those skilled in the art can clearly understand that for the convenience and brevity of the description, only the division of the above-mentioned functional modules is used as an example. In practical applications, the above-mentioned functions can be allocated by different functional modules as required, that is, the internal structure of the device is divided into different functional modules to complete all or part of the functions described above. For the specific working process of the device described above, reference may be made to the corresponding process in the foregoing method embodiment, which is not repeated here.

Finally, it should be noted that the above embodiments are only used to illustrate the technical solutions of the present disclosure, and not to limit them; although the present disclosure has been described in detail with reference to the foregoing embodiments, those of ordinary skill in the art should understand that: the technical solutions recorded in the foregoing embodiments can still be modified, or some or all of the technical features can be equivalently replaced; in the case of no conflict, the features in the embodiments of the present invention can be combined arbitrarily; and these modifications or replacements do not cause the essence of the corresponding technical solutions to deviate from the scope of the technical solutions of the embodiments of the present disclosure.

What is claimed is:

1. A semiconductor material based on metal nanowires and porous nitride, comprising:
    a substrate;
    a buffer layer formed on the substrate;
    a composite material layer formed on the buffer layer, comprising:
        a transverse porous nitride template layer; and
        a plurality of metal nanowires filled in pores of the transverse porous nitride template layer,
    wherein the transverse porous nitride template layer is n-type doped, and is configured to: provide an electrochemical path for the synthesis of metal nanowires and serve as a working electrode;
    wherein a direction in which the nanowires extend is parallel to a surface of the substrate facing the composite material layer;
    wherein a preparing material of the transverse porous nitride template layer is GaN, a preparing material of the metal nanowires is Ag, and a transverse porous GaN layer and Ag nanowires are combined to form the composite material layer, wherein diameters of the pores in a transverse porous GaN layer are 40 nm, lengths of the pores are 150 μm, and diameters of Ag nanowires are 40 nm; and
    wherein the semiconductor material based on the Ag nanowires and the transverse porous GaN layer has a light absorptivity greater than 50% and less than 70% in a wavelength range from 400 nm to 800 nm.

2. The semiconductor material according to claim 1, wherein the metal nanowires are a monocrystal.

3. The semiconductor material according to claim 1, wherein a preparing material of the buffer layer comprises: GaN, AlN, ZnO or grapheme grown at a low temperature.

4. The semiconductor material according to claim 1, wherein morphologies of the metal nanowires comprise: at least one of cylindrical shape and a triangular prismatic shape.

5. A preparation method for preparing the semiconductor material based on the metal nanowires and the porous nitride according to claim 1, comprising:
    preparing the substrate, and growing and preparing the buffer layer and an n-type nitride epitaxial layer on the substrate;
    making the n-type nitride epitaxial layer into the transverse porous nitride template layer;
    preparing the metal nanowires in the pores of the transverse porous nitride template layer to obtain the composite material layer, so as to make the semiconductor material based on the metal nanowires and the transverse porous nitride.

6. The preparation method according to claim 5, wherein the transverse porous nitride template layer is used as a carrier, and the metal nanowires are prepared in the pores of the transverse porous nitride template layer by an electrochemical deposition method.

7. The preparation method according to claim 6, wherein preparing the metal nanowires in the pores of the transverse porous nitride template layer by the electrochemical deposition method comprises:

preparing an electroplating solution;

immersing the transverse porous nitride template layer in the electroplating solution, and performing an electroplating deposition to obtain the metal nanowires by using the immersed transverse porous nitride template layer as a working electrode, using a Pt sheet as a counter electrode, and using an Ag/AgCl electrode as a reference electrode, so as to make the composite material layer.

8. The preparation method according to claim 5, wherein preparing the buffer layer and the n-type nitride epitaxial layer on the substrate comprises: using a metal-organic chemical vapor deposition method to sequentially grow a low-temperature buffer layer and the n-type nitride epitaxial layer on the substrate.

9. The preparation method according to claim 5, wherein making the n-type nitride epitaxial layer into the transverse porous nitride template layer comprises: preparing the transverse porous nitride template layer on the n-type nitride epitaxial layer by an electrochemical corrosion method, and removing a residual electrochemical corrosive electrolyte by ultrasonic cleaning with deionized water.

10. The preparation method according to claim 6, wherein the electrochemical deposition comprises: a constant voltage method, a constant current method, or a pulse voltage method.

11. The preparation method according to claim 7, wherein the electroplating solution comprises: $AgNO_3/H_3BO_3$, $HAuCl_4/Na_2SO_3/Na_2S_2O_3$ or $AlCl_3/NaCl/KCl$.

12. The preparation method according to claim 7, wherein a temperature of the electroplating deposition is 25~150° C.

13. The preparation method according to claim 7, wherein in the process of preparing the electroplating solution, the electrolyte is stirred and dissolved for 30~120 min.

14. The preparation method according to claim 7, wherein an immersion time of the transverse porous nitride template layer is 30~120 min.

\* \* \* \* \*